United States Patent
Yueh

(10) Patent No.: US 6,812,398 B2
(45) Date of Patent: Nov. 2, 2004

(54) SEPARABLE SOLAR ENERGY STORAGE DEVICE

(75) Inventor: Ching Yueh, Taipei (TW)

(73) Assignee: Test Rite International Company, Ltd., Taipei (TW)

( * ) Notice: Subject to any disclaimer, the term of this patent is extended or adjusted under 35 U.S.C. 154(b) by 0 days.

(21) Appl. No.: 10/302,150

(22) Filed: Nov. 25, 2002

(65) Prior Publication Data

US 2004/0099302 A1 May 27, 2004

(51) Int. Cl.[7] .................. H01L 31/048; H01L 31/05
(52) U.S. Cl. .................. 136/246; 136/259; 136/291; 136/293; 136/244; 136/251; 257/436; 257/432; 359/591
(58) Field of Search .................. 136/246, 259, 136/291, 293, 244, 251; 257/436, 432; 359/597, 591

(56) References Cited

U.S. PATENT DOCUMENTS 4,525,031 A * 6/1985 Mori .................. 359/597
5,089,055 A * 2/1992 Nakamura .................. 136/248
5,575,860 A * 11/1996 Cherney .................. 136/245

FOREIGN PATENT DOCUMENTS

| JP | 56-5505 A | * | 1/1981 |
| JP | 7-221692 A | * | 8/1995 |
| JP | 10-150215 | * | 6/1998 |
| JP | 11-103336 A | * | 4/1999 |

* cited by examiner

*Primary Examiner*—Alan Diamond
(74) *Attorney, Agent, or Firm*—Bacon & Thomas

(57) ABSTRACT

A separable solar energy storage device, comprising a solar energy reception device, a solar energy conversion circuit, an extension cord for connecting the solar energy reception device and the solar energy conversion circuit, and storage batteries connecting to the solar energy conversion circuit, the solar energy reception device can be disposed, through connection to the extension cord, at the optimal position for the most efficient reception of solar energy, so as to enable storage batteries to achieve the optimal energy-storage efficiency.

2 Claims, 9 Drawing Sheets

SEPARABLE SOLAR ENERGY STORAGE DEVICE

BACKGROUND OF THE INVENTION

1. Field of the Invention

The invention relates to a separable solar energy storage device, wherein the solar energy reception device for receiving solar energy can be placed, through connection to the extension cord, at the optimal position for the most efficient reception of solar energy, thus achieving the optimal energy-storage efficiency.

2. Description of the Related Art

The conventional solar energy lamp 5 is shown in FIG. 9, comprising a lamp head 50 and a lamp shade 55 disposed underneath the lamp head 50, the lamp head 50 includes a transparent cover 51 disposed on the very top, a solar energy plate 52 and a light-sensitive electric resistance 53 covered by the transparent cover 51, a solar energy conversion circuit, storage batteries and a lamp base (not shown in FIG. 9) disposed underneath the solar energy plate 52 and the light-sensitive electric resistance 53, a lamp tube 56 that, engaged by screws with the lamp base, is disposed inside the lamp shade 55, and a ring 54 fixatedly disposed around the lamp head 50 for a hanging rope 57 to be fastened onto the lamp head 50.

The conventional solar energy lamp 5 can be hung on trees outdoors through hanging rope 57 disposed thereon. During daylight hours, the solar energy plate 52 disposed inside the lamp head 50 is to face upwardly and thus able to absorb sunlight, with solar energy collected being later on converted into direct current (D.C.) through the solar energy conversion circuit and stored in the storage batteries. During nighttime as the light-sensitive electric resistance 53 receives no sunlight signal, the electrical circuit then enables the storage batteries to release electricity stored therein to provide with electricity needed for lighting the lamp tube 56, thus the solar energy lamp 5 can provide soft illumination at night.

Since numerous homeowners in Europe and the U.S. have yards or gardens around their houses, they often install lamps therein to create soothing ambience at night for improving their quality of life. The solar energy lamp 5 is prevalently utilized in both Europe and the U.S. for its design of environmental protection purpose and soft lighting, without adversely affecting the overall scenery of gardens or yards, for the solar energy lamp 5 may be hung on trees.

However, drawbacks exist in the conventional solar energy lamp 5, wherein the solar energy plate 52, fixatedly disposed inside the lamp head 50 that is integrally formed with the lamp shade 55, is susceptible to be shaded by branches or leaves, thus adversely affecting the efficiency of its absorbing solar energy, causing the storage batteries unable to provide enough energy for the lamp tube to keep lightening, with the result being that the illumination time for the solar energy lamp 5 is to be confined.

Therefore, the conventional solar energy lamp 5 is unable to place the solar energy plate 52 disposed therein to the optimal position for absorbing the solar energy and thus is unable to provide with efficient energy storage, an apparent drawback that needs to be improved.

Though the U.S. Pat. No. 4,525,031 provides with a separable solar energy lamp, such solar energy lamp is unable to store electricity converted from solar energy, thus unable to provide with further usages.

SUMMARY OF THE INVENTION

The primary object of the present invention is to provide with a separable solar energy storage device, comprising a solar energy reception device, a solar energy conversion circuit, an extension cord for connecting the solar energy reception device and the solar energy conversion circuit, and storage batteries connected to the solar energy conversion circuit, the solar energy reception device is connected by the extension cord, thus able to be positioned at the optimal location for absorbing solar energy, and thus enabling the storage batteries to achieve the optimal effect of electricity storage.

The extension cord is connected through plug-in connection to both the solar energy reception device and the solar energy conversion circuit.

The extension cord can further be fixatedly connected directly to both the solar energy reception device and the solar energy conversion circuit.

The solar energy reception device at least includes the solar energy plate and the light-sensitive electric resistance.

After storing electricity, the storage batteries can provide all kinds of appliances such as lamps and heaters with electricity.

BRIEF DESCRIPTION OF THE DRAWINGS

These and other features, aspects and advantages of the present invention will become better understood with regard to the following description, appended claims and accompanying drawings that are provided only for further elaboration without limiting or restricting the present invention, where:

DETAILED DESCRIPTION OF THE PREFERRED EMBODIMENTS

The following is a detailed description of the best presently known modes of carrying out the inventions. This description is not to be taken in a limiting sense, but is made merely for the purpose of illustrating the general principles of the inventions.

Figure 1:
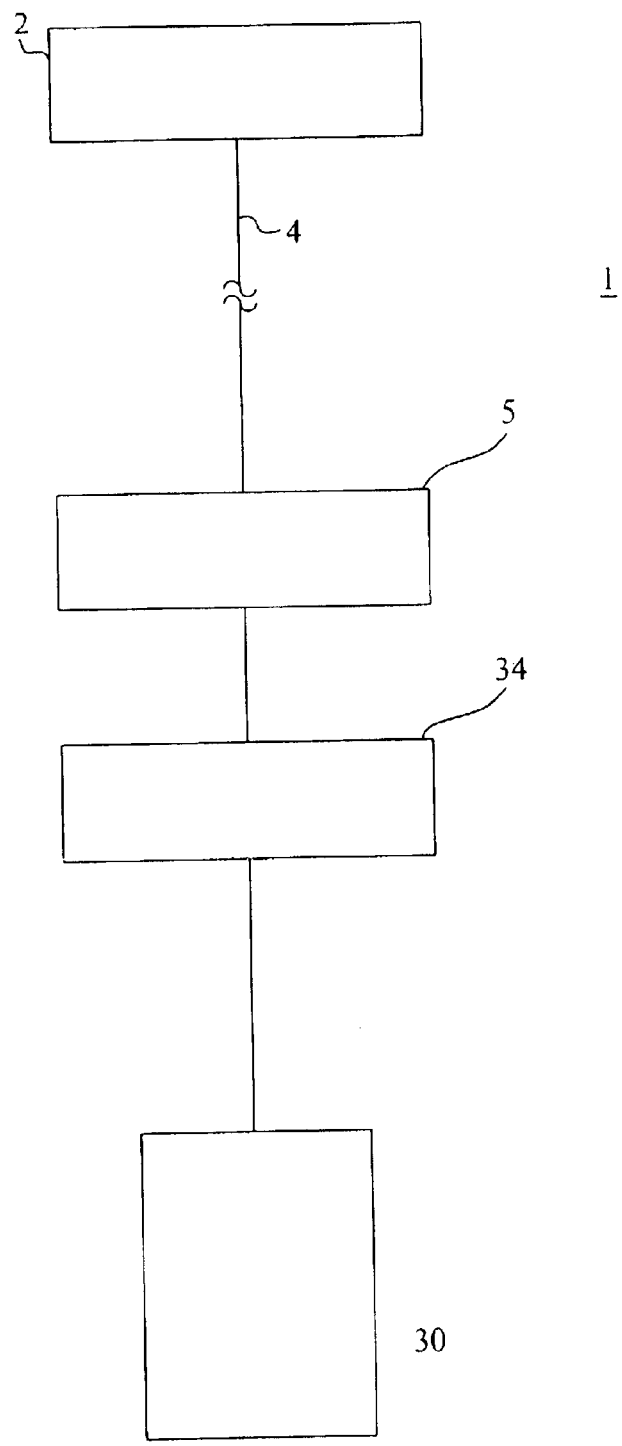
FIG. 1 shows a block diagram of the separable solar energy storage device of the present invention

As shown in FIG. 1, the separable solar energy storage device 1 of the present invention comprises a solar energy reception device 2, a solar energy conversion circuit 5, an extension cord 4 for connecting both the solar energy reception device 2 and the solar energy conversion circuit 5, and storage batteries 34 connected to the solar energy conversion circuit 5; the solar energy reception device 2 is connected by the extension cord 4, thus able to be positioned at the optimal location for absorbing solar energy, and thus enabling the storage batteries 34 to achieve the optimal effect of electricity storage.

The extension cord 4 is connected through plug-in connection to both the solar energy reception device 2 and the solar energy conversion circuit 5, or is fixatedly connected directly to both the solar energy reception device 2 and the solar energy conversion circuit 5. In addition, the solar energy reception device 2 at least includes the solar energy plate and the light-sensitive electric resistance, and after storing electricity, the storage batteries 34 can provide all kinds of appliances such as lamps and heaters with electricity.

Regarding the separable solar energy storage device 1 of the present invention being applied to lighting purposes, the separable solar energy lamp 10 is utilized to elaborate embodiments in detail in accordance with FIG. 2 to FIG. 8.

Figure 2:
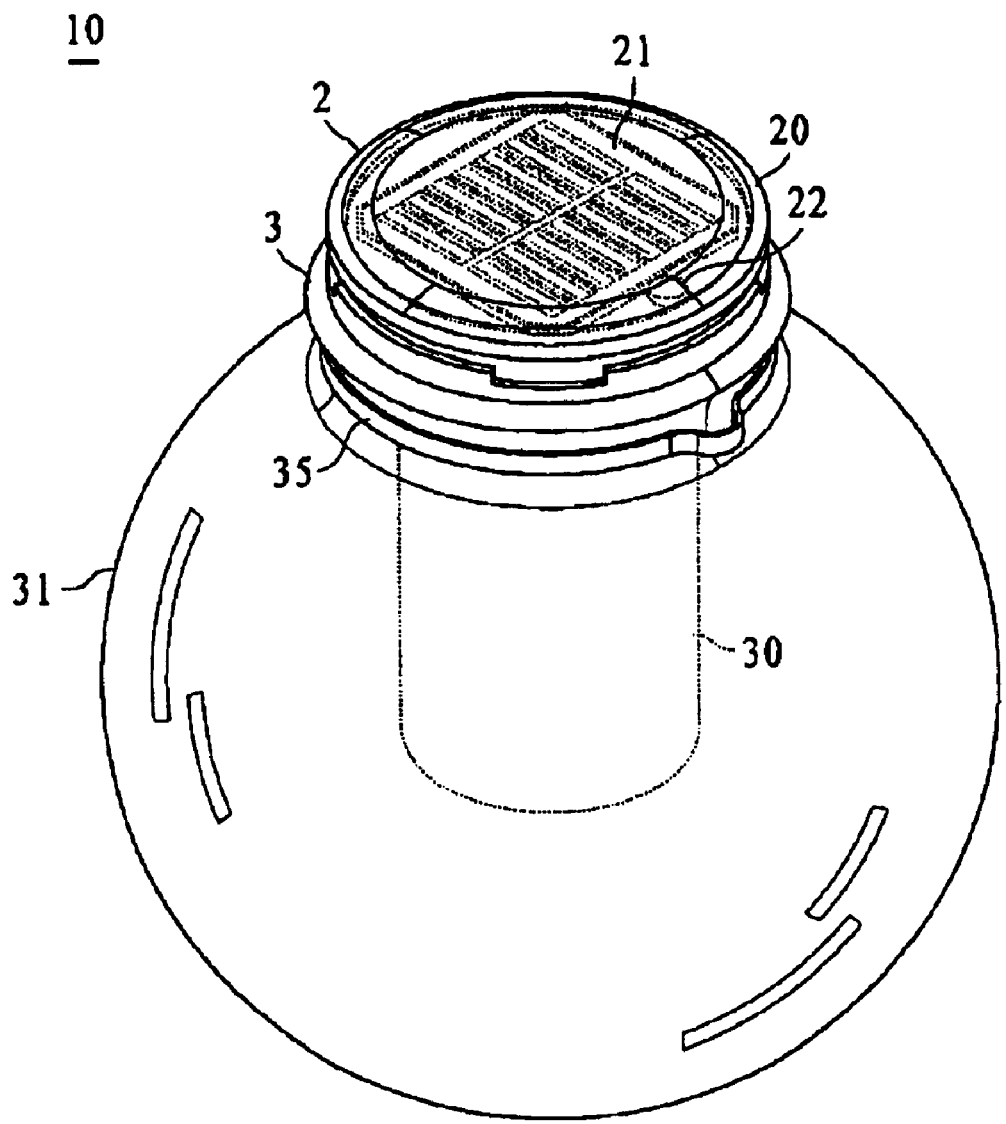
FIG. 2 shows a perspective view of the present invention being applied to the separable solar energy lamp, manifesting that the solar energy reception device and the lamp base being integrally formed.

As shown in FIG. 2, as both the solar energy reception device 2 and the lamp base 3 of the separable solar energy lamp 10 are connected (not being separated yet), the appearance thereof is largely identical to that of the conventional solar energy lamp 5. The conventional hanging rope 57 is omitted for better elaboration on the structure of the separable solar energy lamp 10.

Figure 3:
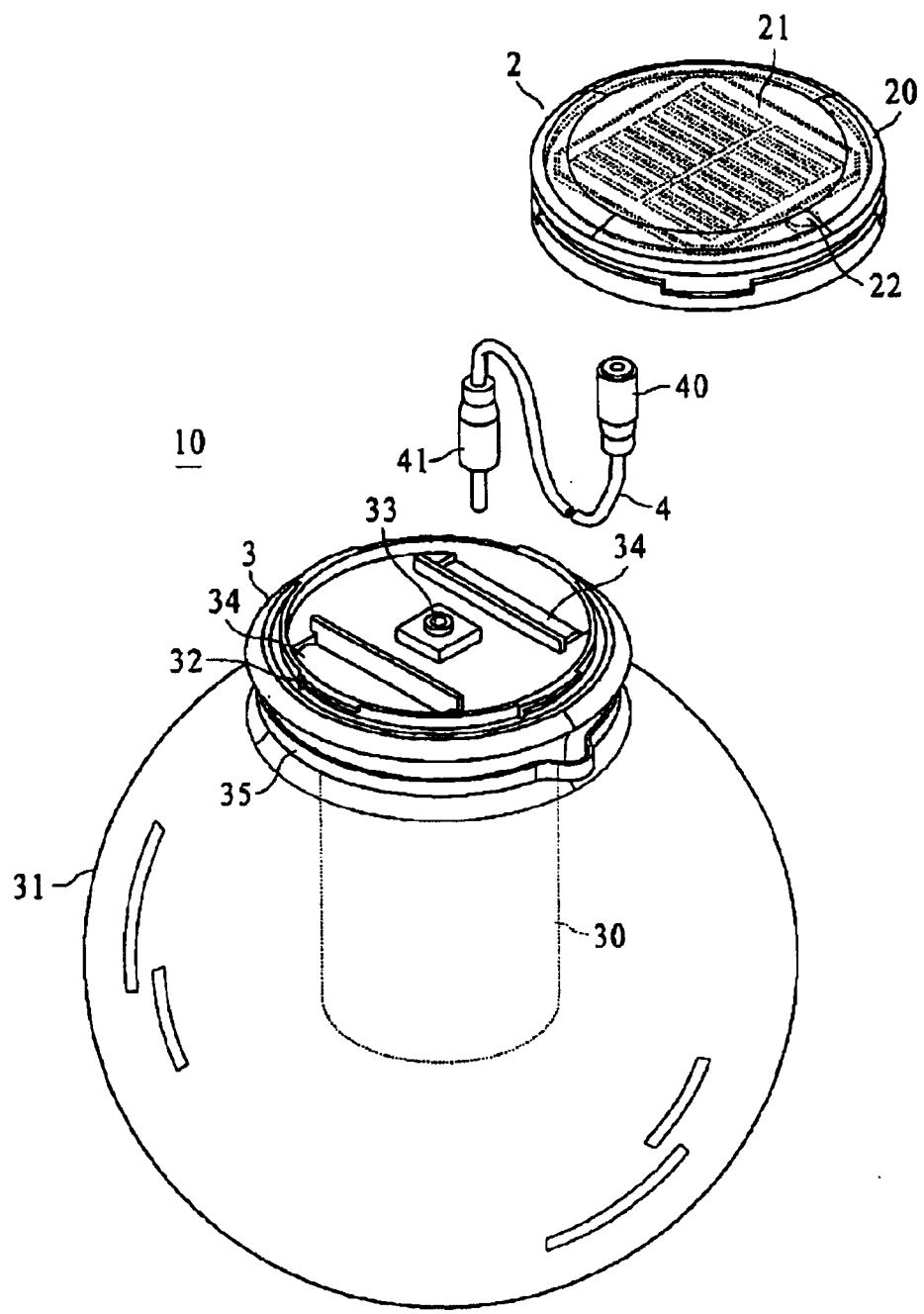
FIG. 3 shows a state of the solar energy reception device of the solar energy lamp being separated from the lamp base shown in FIG. 2, and further manifesting the extension cord utilized for connecting both the solar energy reception device and the lamp base.
Figure 4:
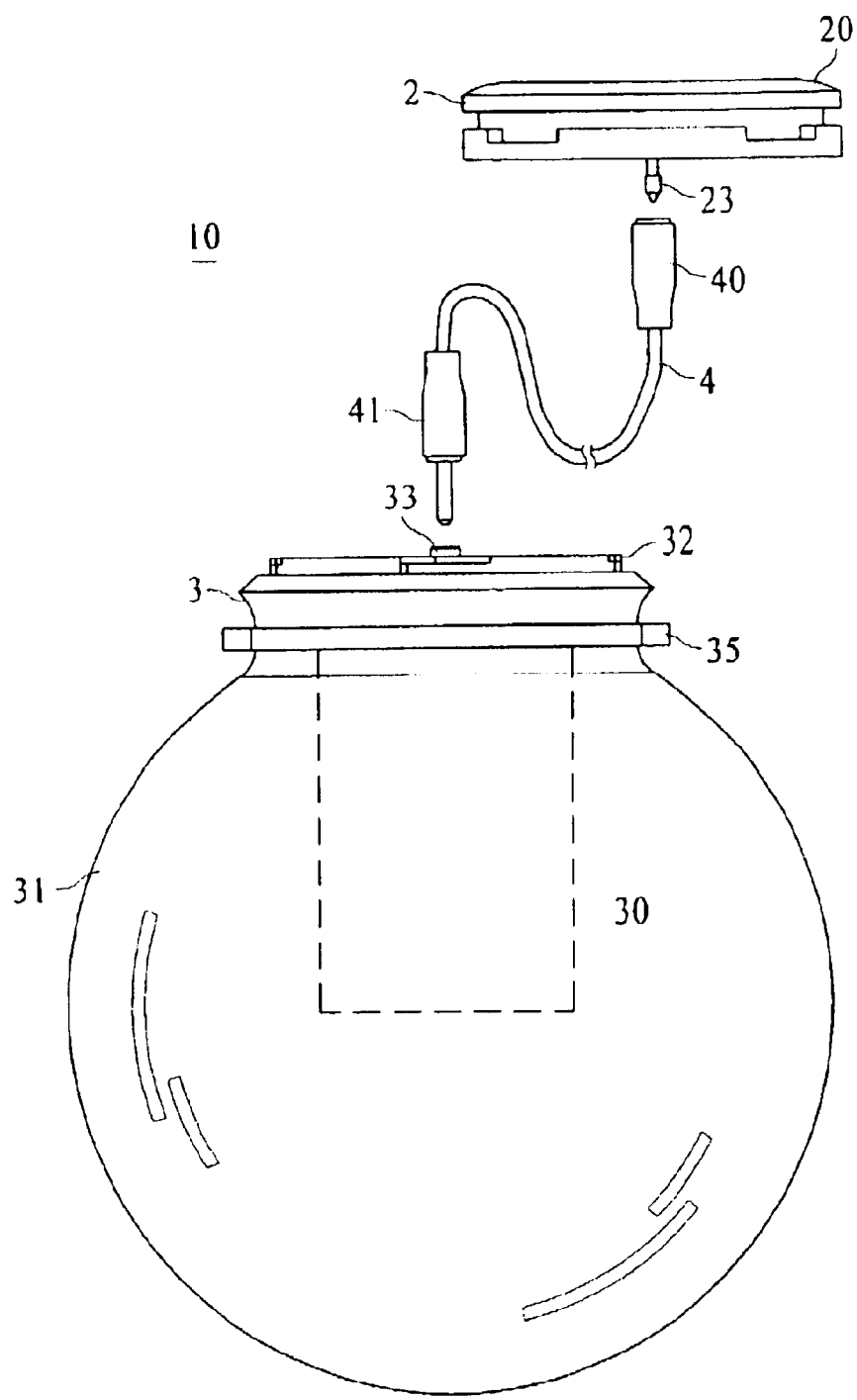
FIG. 4 shows a front view of the separable solar energy lamp in the state of being separated in FIG. 3.
Figure 5:
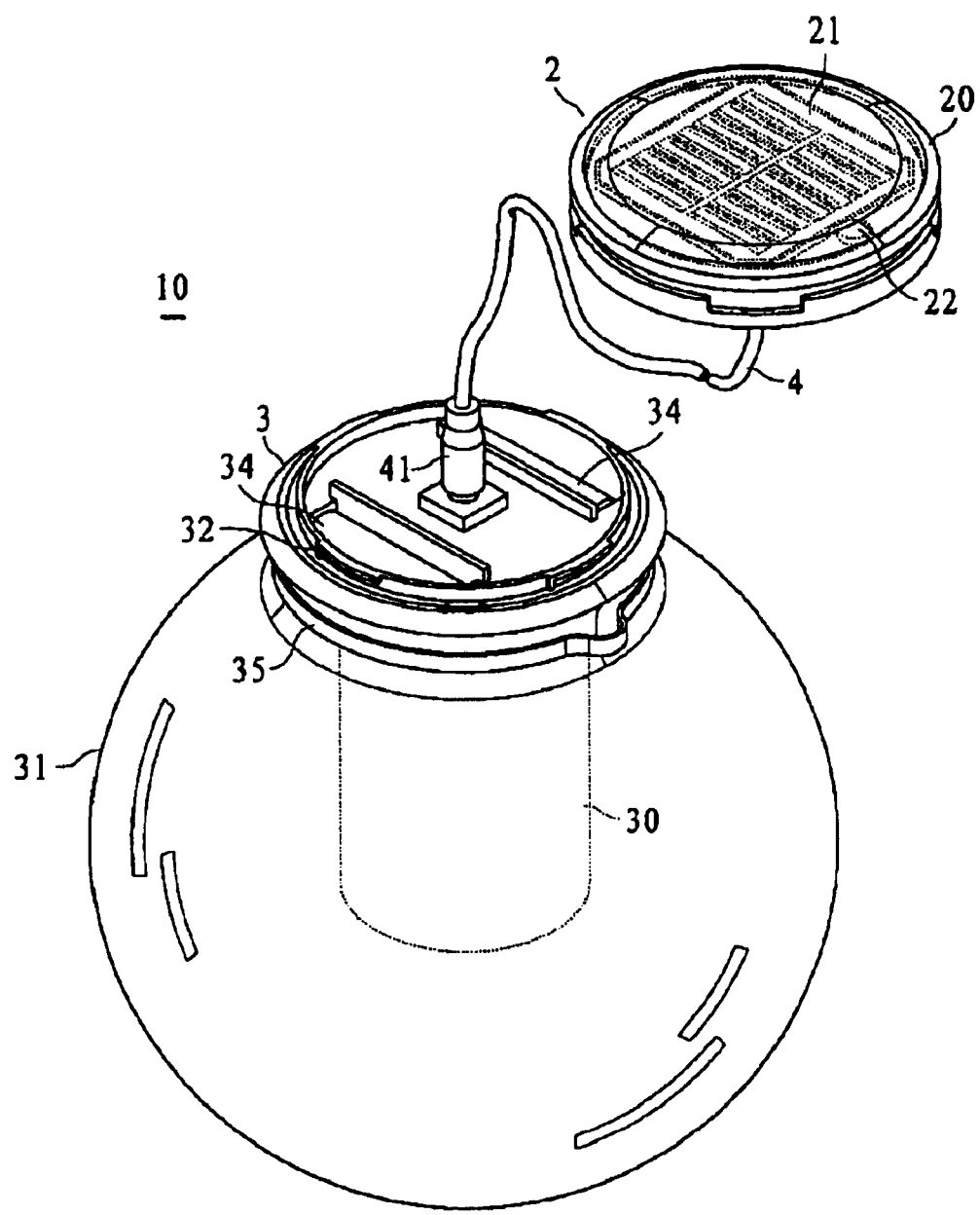
FIG. 5 shows a perspective view of the solar energy reception device and the lamp base shown in FIG. 3 being in the state of separation with the extension cord utilized to connect both through plug-in connection.
Figure 6:
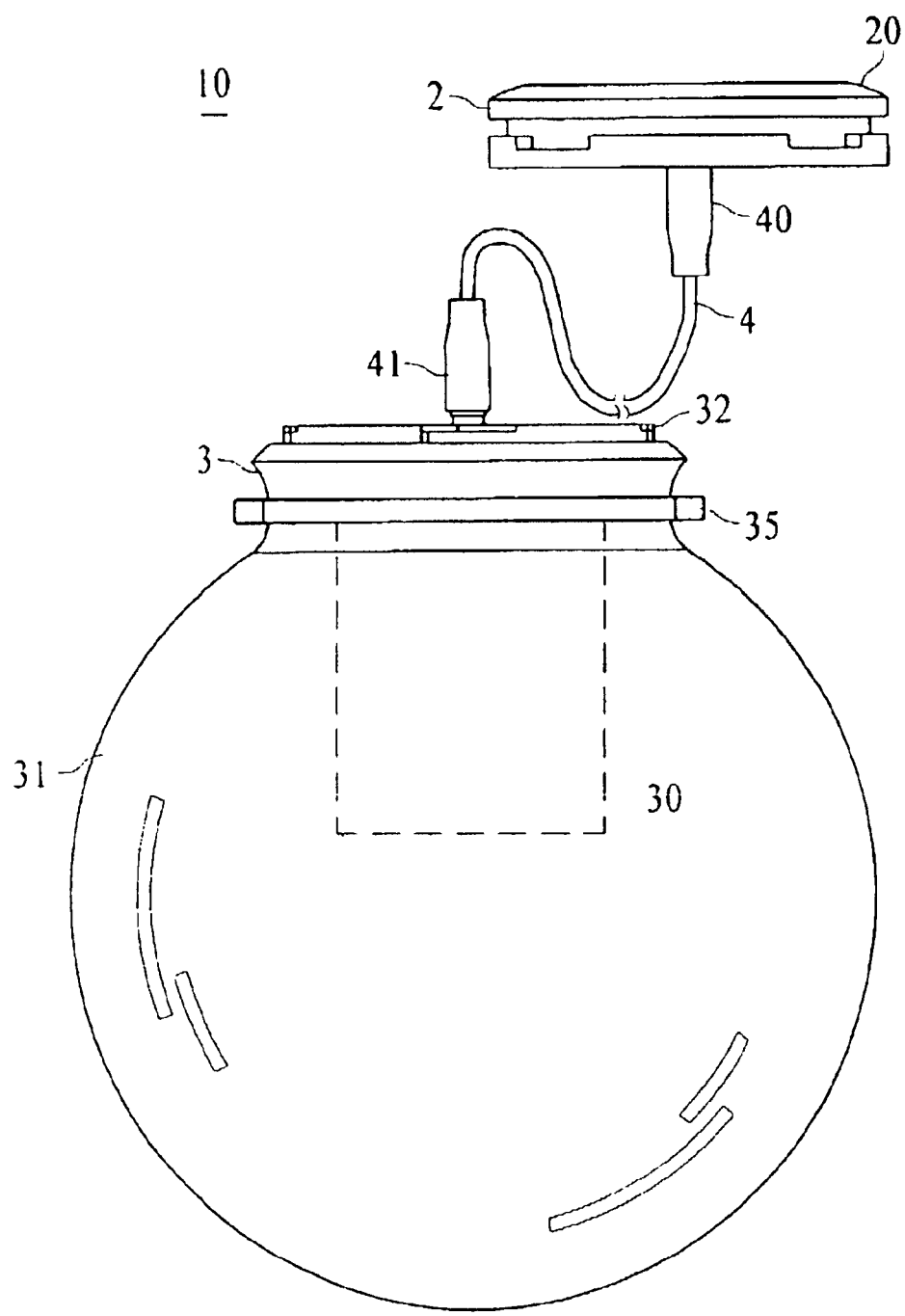
FIG. 6 shows a front view of FIG. 5.

Please refer to FIG. 2 in accordance with FIG. 3 and FIG. 4, the separable solar energy lamp 10 comprising a solar energy reception device 2, a lamp base 3, a solar energy conversion circuit 5 internally disposed in the lamp base 3, storage batteries 34 internally disposed in the lamp base 3, a lamp shade 31 fixatedly disposed underneath the lamp base 3, the lamp tube 30 that, engaged by screws with the lamp base 3, is disposed inside the lamp shade 31, and the extension cord 4 utilized for connecting both the solar energy reception device 2 and the lamp base 3. The storage batteries 34 are connected to the solar energy conversion circuit 5 (please refer to FIG. 1), wherein a socket 33 is disposed for external plug-ins.

The solar energy reception device 2 further includes a transparent cover 20 disposed on the very top, a solar energy plate 21 and a light-sensitive electric resistance 22 covered by the transparent cover 20, and a terminal 23 utilized for external plug-ins to form the circuit for both the solar energy plate 21 and the light-sensitive electric resistance 22.

The lamp base 3 also includes a retaining lock 32 to engage with the corresponding retaining lock (not shown in drawings) of the solar energy reception device 2, thus integrally forming the lamp base 3 and the solar energy reception device 2; the conventional ring 35 and hanging rope (not shown in drawings) are installed thereon.

As the terminal 23 disposed on the solar energy reception device 2 is directly connected through plug-in connection to the socket 33 of the solar energy conversion circuit 5, the two electrical circuits are to be connected. And then the solar energy reception device 2 and the lamp base 3 are relatively rotated to be integrally formed through both the retaining locks thereof as shown in FIG. 2. Under such arrangement, the embodiment can be implemented so that the solar energy plate 21 in the separable solar energy storage device 1 being hung shall not be shaded or affected when absorbing sunlight. To achieve such object of the embodiment, the solar energy plate 21 disposed upwards in the interior of the solar energy reception device 2 is to absorb sunlight, and the solar energy collected is to be converted into direct current through the solar energy conversion circuit 5, with the storage batteries storing the converted electricity. During nighttime, when the light-sensitive electric resistance 22 cannot receive any sunlight signal, the circuit 5 is to control the storage batteries 34 to release electricity, so that the lamp tube 30 is to be lighted and thus provides with soft illumination.

Once the solar energy plate 21 of the separable solar energy lamp 10, which is hung on objects such as trees, is shaded or affected so that the sunlight-absorbing function is deterred in any way, the solar energy reception device 2 and the lamp base 3 can be detached from each other under the engaging state to form the state of separation as shown in FIG. 3 (FIG. 4), along with the terminal 23 of the solar energy reception device 2 being detached from the socket 33 of the solar energy conversion circuit 5, thus causing the electrical circuit to break off. At this time, the two electrical circuits can be connected by the plug-in connection of both the female connecting means 40 and the male connecting means 41 of the extension cord 4 respectively to the terminal 23 of the solar energy reception device 2 and the socket 33 of the solar energy conversion circuit 5, thus forming the state of separation for the separable solar energy lamp 10 shown in FIG. 5 and FIG. 6. Since the solar energy reception device 2 can be separated from the lamp base 3 by the connection of the extension cord 4, the solar energy reception device 2 can be placed at the optimal position for absorbing sunlight, thus prolonging the illumination time for the lamp tube 30.

Figure 7:
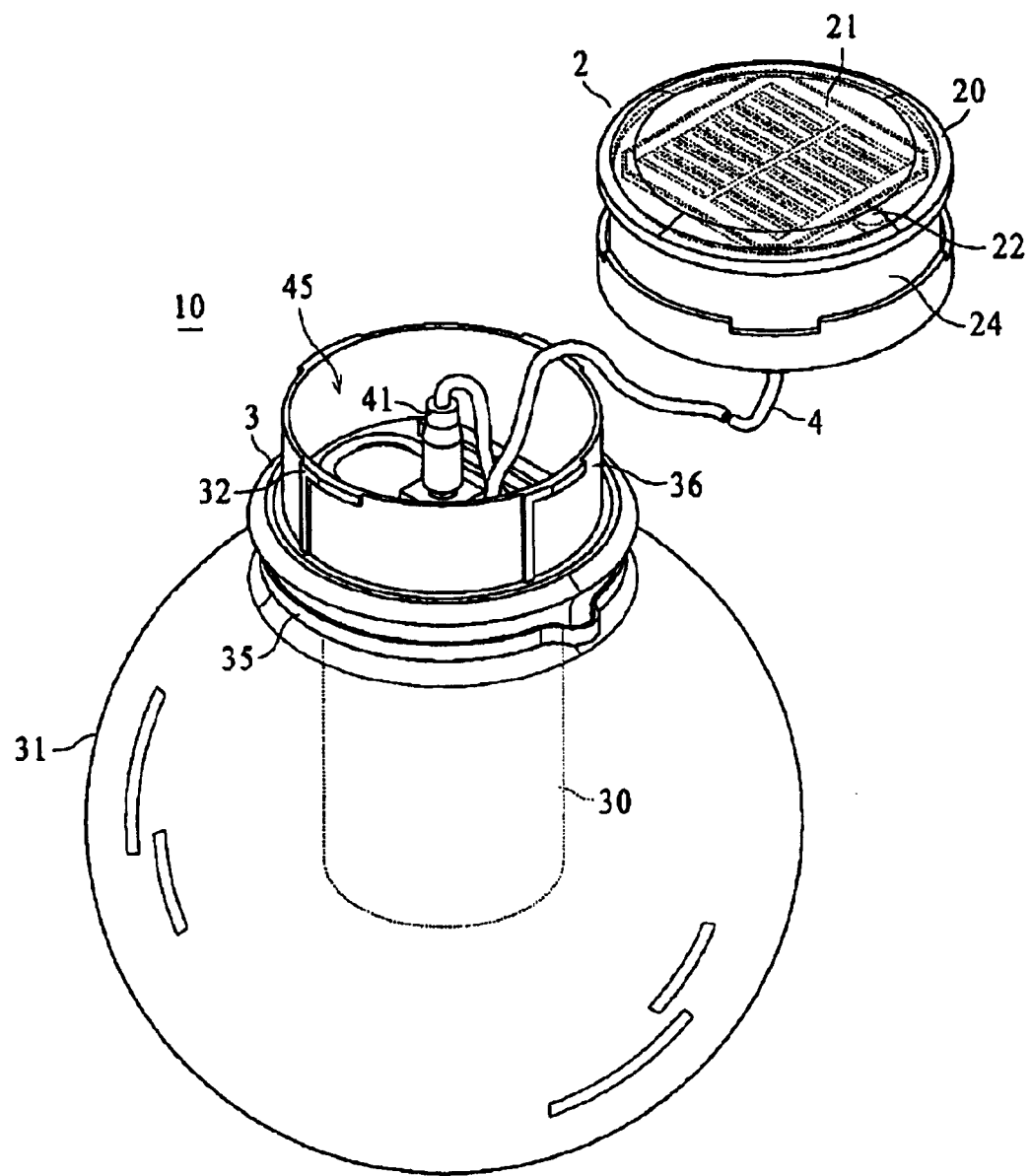
FIG. 7 shows another embodiment of the present invention being applied to the separable solar energy lamp, manifesting that the lamp base having space to receive the extension cord.

Another embodiment of the separable solar energy lamp 10 is shown in FIG. 7, wherein the lamp base 3 is to extend upwards so as to form a circular frame 36 whereby a space 45 is formed to receive the extension cord 4, a design that solves the problem of keeping the extension cord 4. Corresponding to the lamp base 3, the solar energy reception device 2 can also be disposed with a circular frame 24 to engage the lamp base 3, along with the length of the terminal in the solar energy reception device 2 being lengthened so as to plug in the socket of the lamp base 2.

Figure 8:
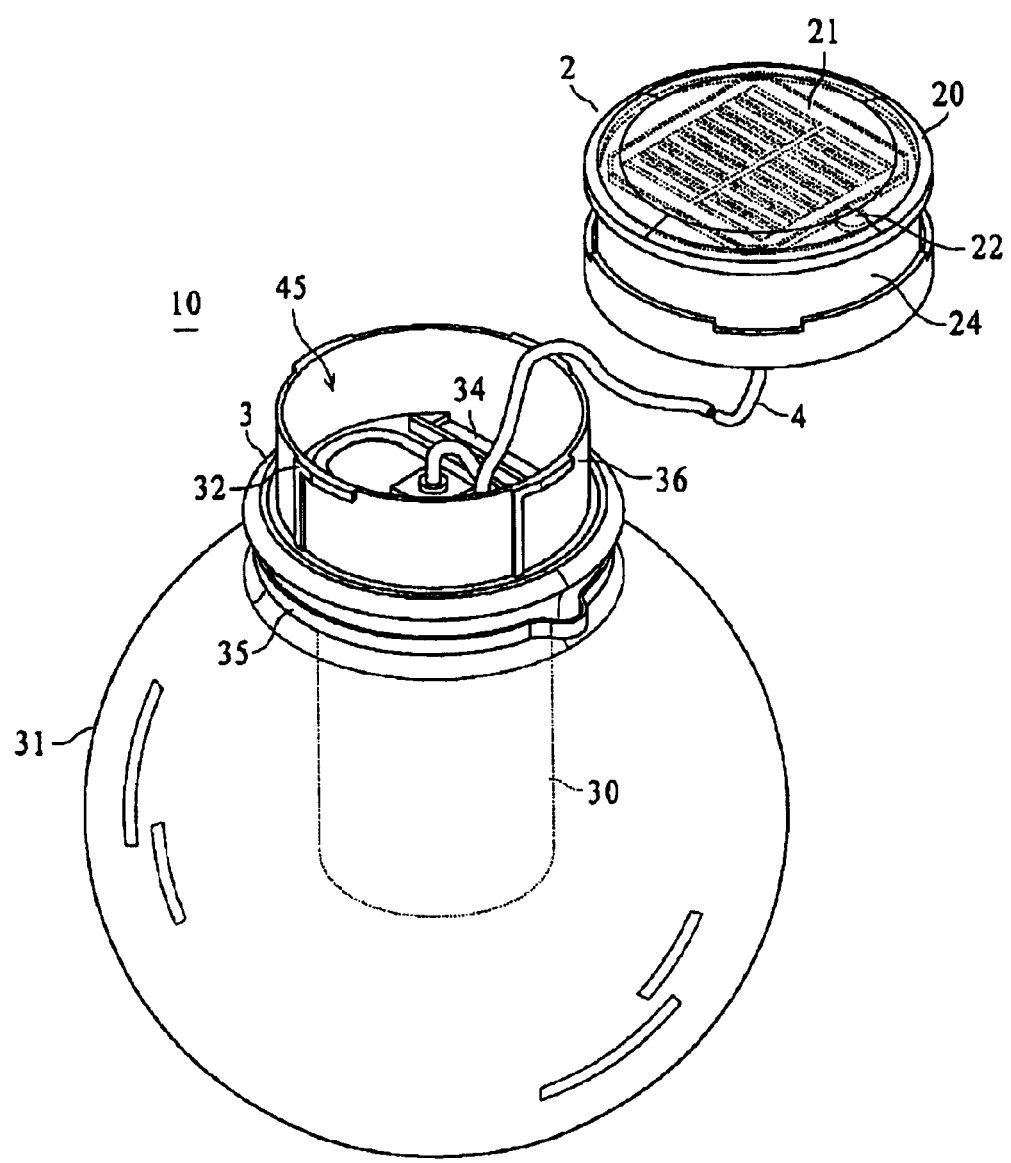
FIG. 8 shows yet another embodiment of the present invention being applied to the separable solar energy lamp, manifesting that the solar energy reception device and the lamp base being in the state of separation with the extension cord utilized through fixated connection directly thereto.
Figure 9:
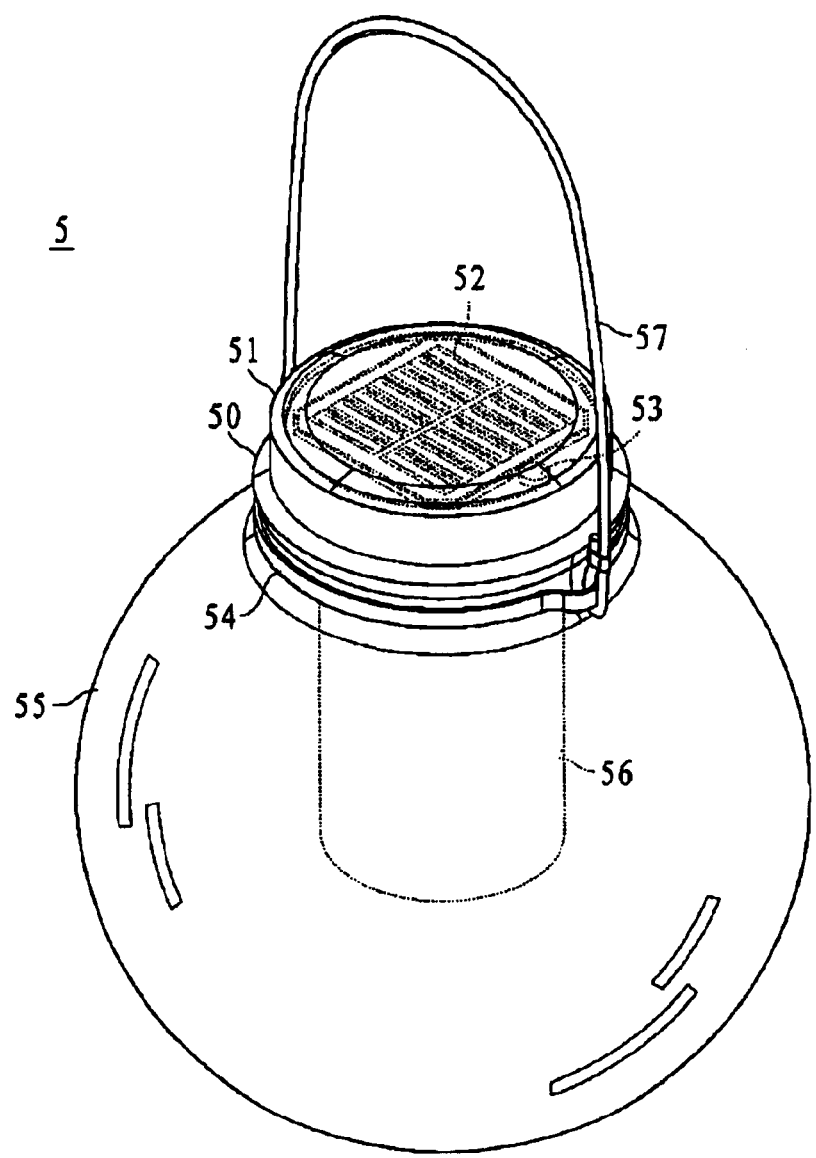
FIG. 9 shows a perspective view of the conventional solar energy lamp.

FIG. 8 shows yet another embodiment of the application regarding the extension cord 4, wherein no female connecting means 40 and the male connecting means 41 are disposed on the extension cord 4 as shown in FIG. 3 to FIG. 6, instead both ends of the extension cord 4 are fixatedly connected directly to the solar energy reception device 2 and the solar energy conversion circuit 5 respectively. In the embodiment shown in FIG. 8, the design of space 45 shown in FIG. 7 is also included so as to keep the extension cord 4.

The present invention relates to a separable solar energy storage device, wherein the solar energy reception device can be placed at the optimal position through the connection of the extension cord for absorbing solar energy, so as to achieve the optimal energy-storage effect.

Although the present invention has been described in considerable detail with reference to certain preferred embodiments thereof, those skilled in the art can easily understand that all kinds of alterations and changes can be made within the spirit and scope of the appended claims. For example, for achieving the water-proving purpose, the lamp base 3 can be disposed with a waterproof rubber layer, along with sealing rings disposed at the engagement of both retaining locks of the lamp base 3 and the solar energy reception device 2, so as to prevent raindrops or other liquids from infiltrating the solar energy conversion circuit and causing short circuitry; also for effectively fastening the solar energy reception device 2, certain positioning device such as fixtures can be attached thereon so as to fasten the solar energy reception device 2 onto the place where the solar energy reception device 2 is positioned; the extension cord can be connected with another extension cord to extend the length thereof. Therefore, the spirit and scope of the appended claims should not be limited to the description of the preferred embodiments contained herein.

What is claimed is:

1. A separable solar energy device, comprising a solar energy reception device including a solar energy plate and a light-sensitive electric resistance a solar energy conversion circuit, an extension cord fixatedly connected directly to said solar energy reception device and said solar energy conversion circuit, and storage batteries connected to said solar energy conversion circuit, said solar energy reception device being placed at a position through the connection of the extension cord for absorbing solar energy, so as to enable said storage batteries to achieve an energy-storage effect.

2. The separable solar energy storage device as in claim 1, wherein electricity stored in said storage batteries is provided for all kinds of electrical appliances.

* * * * *